US009413491B1

(12) United States Patent
Sterin

(10) Patent No.: US 9,413,491 B1
(45) Date of Patent: Aug. 9, 2016

(54) SYSTEM AND METHOD FOR MULTIPLE DIMENSION DECODING AND ENCODING A MESSAGE

(71) Applicant: DensBits Technologies LTD., Haifa (IL)

(72) Inventor: Eli Sterin, Yokneam-Ilit (IL)

(73) Assignee: AVAGO TECHNOLOGIES GENERAL IP (SINGAPORE) PTE. LTD., Yishun (SG)

( * ) Notice: Subject to any disclaimer, the term of this patent is extended or adjusted under 35 U.S.C. 154(b) by 0 days.

(21) Appl. No.: 14/953,448

(22) Filed: Nov. 30, 2015

Related U.S. Application Data

(63) Continuation of application No. 14/049,070, filed on Oct. 8, 2013, now abandoned.

(51) Int. Cl.
| | |
|---|---|
| *H03M 13/00* | (2006.01) |
| *H04L 1/00* | (2006.01) |
| *H04L 29/06* | (2006.01) |
| *H03M 13/15* | (2006.01) |

(52) U.S. Cl.
CPC ........... *H04L 1/0041* (2013.01); *H03M 13/151* (2013.01); *H04L 1/0045* (2013.01); *H04L 69/22* (2013.01)

(58) Field of Classification Search
CPC .............. H03M 13/09; H03M 13/152; H03M 13/2918; H03M 13/293; H03M 13/2945; H03M 13/2948; H03M 13/43; H03M 13/6561; H03M 13/2927; H03M 13/1515; H03M 13/19; H03M 13/23; H03M 13/2957; H03M 13/2906; H03M 13/1565; G06F 11/10; G06F 11/1068
See application file for complete search history.

(56) References Cited

U.S. PATENT DOCUMENTS

| | | | |
|---|---|---|---|
| 4,430,701 A | 2/1984 | Christian et al. | |
| 4,463,375 A | 7/1984 | Macovski | |
| 4,584,686 A | 4/1986 | Fritze | |
| 4,589,084 A | 5/1986 | Fling et al. | |
| 4,777,589 A | 10/1988 | Boettner et al. | |

(Continued)

FOREIGN PATENT DOCUMENTS

WO WO2009053963 A2 4/2009

OTHER PUBLICATIONS

Search Report of PCT Patent Application WO 2009/118720 A3, Mar. 4, 2010.

(Continued)

*Primary Examiner* — Guerrier Merant
(74) *Attorney, Agent, or Firm* — Reches Patents

(57) ABSTRACT

A system and method for multiple dimensional encoding of a message, the method may include repeating, for each data unit that belongs to the message the stages of: (a) receiving by a processor the data unit; (b) executing by the processor, for each dimension of a plurality of dimensions of the multiple dimension, the stages of: (b.1) restoring a last state of an encoder during an encoding process of a packet that comprises the data unit, wherein the encoding process corresponds to the dimension; (b.2) encoding the data unit by the encoder in correspondence to the dimension to provide an updated state of the encoder; and (b.3) storing the updated state of the encoder as a last state of the encoder; wherein the updated state of the encoder following the encoding of all data units of the message represents redundancy bits; and (c) adding the redundancy bits to the message to provide a multiple dimensional encoded message.

16 Claims, 12 Drawing Sheets

(56) References Cited

U.S. PATENT DOCUMENTS

| | | |
|---|---|---|
| 4,866,716 A | 9/1989 | Weng |
| 5,003,597 A | 3/1991 | Merkle |
| 5,077,737 A | 12/1991 | Leger et al. |
| 5,297,153 A | 3/1994 | Baggen et al. |
| 5,305,276 A | 4/1994 | Uenoyama |
| 5,592,641 A | 1/1997 | Doyle et al. |
| 5,623,620 A | 4/1997 | Alexis et al. |
| 5,640,529 A | 6/1997 | Hasbun |
| 5,657,332 A | 8/1997 | Auclair et al. |
| 5,663,901 A | 9/1997 | Harari et al. |
| 5,724,538 A | 3/1998 | Morris et al. |
| 5,729,490 A | 3/1998 | Calligaro et al. |
| 5,740,395 A | 4/1998 | Wells et al. |
| 5,745,418 A | 4/1998 | Hu et al. |
| 5,778,430 A | 7/1998 | Ish et al. |
| 5,793,774 A | 8/1998 | Usui et al. |
| 5,920,578 A | 7/1999 | Zook et al. |
| 5,926,409 A | 7/1999 | Engh et al. |
| 5,933,368 A | 8/1999 | Hu et al. |
| 5,956,268 A | 9/1999 | Lee |
| 5,956,473 A | 9/1999 | Hu et al. |
| 5,968,198 A | 10/1999 | Balachandran et al. |
| 5,982,659 A | 11/1999 | Irrinki et al. |
| 6,011,741 A | 1/2000 | Harari et al. |
| 6,016,275 A | 1/2000 | Han |
| 6,038,634 A | 3/2000 | Ji et al. |
| 6,081,878 A | 6/2000 | Estakhri et al. |
| 6,094,465 A | 7/2000 | Stein et al. |
| 6,119,245 A | 9/2000 | Hiratsuka |
| 6,182,261 B1 | 1/2001 | Haller et al. |
| 6,192,497 B1 | 2/2001 | Yang et al. |
| 6,195,287 B1 | 2/2001 | Hirano |
| 6,199,188 B1 | 3/2001 | Shen et al. |
| 6,209,114 B1 | 3/2001 | Wolf et al. |
| 6,259,627 B1 | 7/2001 | Wong |
| 6,272,052 B1 | 8/2001 | Miyauchi |
| 6,278,633 B1 | 8/2001 | Wong et al. |
| 6,279,133 B1 | 8/2001 | Vafai et al. |
| 6,301,151 B1 | 10/2001 | Engh et al. |
| 6,370,061 B1 | 4/2002 | Yachareni et al. |
| 6,374,383 B1 | 4/2002 | Weng |
| 6,504,891 B1 | 1/2003 | Chevallier |
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,637,002 B1 | 10/2003 | Weng et al. |
| 6,639,865 B2 | 10/2003 | Kwon |
| 6,674,665 B1 | 1/2004 | Mann et al. |
| 6,675,281 B1 | 1/2004 | Oh et al. |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,968,421 B2 | 11/2005 | Conley |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,149,950 B2 | 12/2006 | Spencer et al. |
| 7,177,977 B2 | 2/2007 | Chen et al. |
| 7,188,228 B1 | 3/2007 | Chang et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,212,426 B2 | 5/2007 | Park et al |
| 7,290,203 B2 | 10/2007 | Emma et al. |
| 7,292,365 B2 | 11/2007 | Knox |
| 7,301,928 B2 | 11/2007 | Nakabayashi et al. |
| 7,315,916 B2 | 1/2008 | Bennett et al. |
| 7,388,781 B2 | 6/2008 | Litsyn et al. |
| 7,395,404 B2 | 7/2008 | Gorobets et al. |
| 7,441,067 B2 | 10/2008 | Gorobets et al. |
| 7,443,729 B2 | 10/2008 | Li et al. |
| 7,450,425 B2 | 11/2008 | Aritome |
| 7,454,670 B2 | 11/2008 | Kim et al. |
| 7,466,575 B2 | 12/2008 | Shalvi et al. |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,610,433 B2 | 10/2009 | Randell et al. |
| 7,613,043 B2 | 11/2009 | Cornwell et al. |
| 7,619,922 B2 | 11/2009 | Li et al. |
| 7,697,326 B2 | 4/2010 | Sommer et al. |
| 7,706,182 B2 | 4/2010 | Shalvi et al. |
| 7,716,538 B2 | 5/2010 | Gonzalez et al. |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,911,848 B2 | 3/2011 | Eun et al. |
| 7,961,797 B1 | 6/2011 | Yang et al. |
| 7,975,192 B2 | 7/2011 | Sommer et al. |
| 8,020,073 B2 | 9/2011 | Emma et al. |
| 8,108,590 B2 | 1/2012 | Chow et al. |
| 8,122,328 B2 | 2/2012 | Liu et al. |
| 8,159,881 B2 | 4/2012 | Yang |
| 8,190,961 B1 | 5/2012 | Yang et al. |
| 8,250,324 B2 | 8/2012 | Haas et al. |
| 8,300,823 B2 | 10/2012 | Bojinov et al. |
| 8,305,812 B2 | 11/2012 | Levy et al. |
| 8,327,246 B2 | 12/2012 | Weingarten et al. |
| 8,407,560 B2 | 3/2013 | Ordentlich et al. |
| 8,417,893 B2 | 4/2013 | Khmelnitsky et al. |
| 2001/0034815 A1 | 10/2001 | Dugan et al. |
| 2002/0063774 A1 | 5/2002 | Hillis et al. |
| 2002/0085419 A1 | 7/2002 | Kwon et al. |
| 2002/0154769 A1 | 10/2002 | Petersen et al. |
| 2002/0156988 A1 | 10/2002 | Toyama et al. |
| 2002/0174156 A1 | 11/2002 | Birru et al. |
| 2003/0014582 A1 | 1/2003 | Nakanishi |
| 2003/0065876 A1 | 4/2003 | Lasser |
| 2003/0101404 A1 | 5/2003 | Zhao et al. |
| 2003/0105620 A1 | 6/2003 | Bowen |
| 2003/0177300 A1 | 9/2003 | Lee et al. |
| 2003/0192007 A1 | 10/2003 | Miller et al. |
| 2004/0015771 A1 | 1/2004 | Lasser et al. |
| 2004/0030971 A1 | 2/2004 | Tanaka et al. |
| 2004/0059768 A1 | 3/2004 | Denk et al. |
| 2004/0080985 A1 | 4/2004 | Chang et al. |
| 2004/0153722 A1 | 8/2004 | Lee |
| 2004/0153817 A1 | 8/2004 | Norman et al. |
| 2004/0181735 A1 | 9/2004 | Xin |
| 2004/0203591 A1 | 10/2004 | Lee |
| 2004/0210706 A1 | 10/2004 | In et al. |
| 2005/0013165 A1 | 1/2005 | Ban |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le-Bars et al. |
| 2005/0144213 A1 | 6/2005 | Simkins et al. |
| 2005/0144368 A1 | 6/2005 | Chung et al. |
| 2005/0169057 A1 | 8/2005 | Shibata et al. |
| 2005/0172179 A1 | 8/2005 | Brandenberger et al. |
| 2005/0213393 A1 | 9/2005 | Lasser |
| 2005/0243626 A1 | 11/2005 | Ronen |
| 2006/0059406 A1 | 3/2006 | Micheloni et al. |
| 2006/0059409 A1 | 3/2006 | Lee |
| 2006/0064537 A1 | 3/2006 | Oshima et al. |
| 2006/0101193 A1 | 5/2006 | Murin |
| 2006/0195651 A1 | 8/2006 | Estakhri et al. |

(56) References Cited

U.S. PATENT DOCUMENTS

| | | |
|---|---|---|
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |
| 2006/0282411 A1 | 12/2006 | Fagin et al. |
| 2006/0284244 A1 | 12/2006 | Forbes et al. |
| 2006/0294312 A1 | 12/2006 | Walmsley |
| 2007/0025157 A1 | 2/2007 | Wan et al. |
| 2007/0063180 A1 | 3/2007 | Asano et al. |
| 2007/0081388 A1 | 4/2007 | Joo |
| 2007/0098069 A1 | 5/2007 | Gordon |
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0140006 A1 | 6/2007 | Chen et al. |
| 2007/0143561 A1 | 6/2007 | Gorobets |
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata et al. |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2007/0297226 A1 | 12/2007 | Mokhlesi |
| 2008/0010581 A1 | 1/2008 | Alrod et al. |
| 2008/0028014 A1 | 1/2008 | Hilt et al. |
| 2008/0049497 A1 | 2/2008 | Mo |
| 2008/0055989 A1 | 3/2008 | Lee et al. |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0112238 A1 | 5/2008 | Kim et al. |
| 2008/0116509 A1 | 5/2008 | Harari et al. |
| 2008/0126686 A1 | 5/2008 | Sokolov et al. |
| 2008/0127104 A1 | 5/2008 | Li et al. |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0137414 A1 | 6/2008 | Park et al. |
| 2008/0141043 A1 | 6/2008 | Flynn et al. |
| 2008/0148115 A1 | 6/2008 | Sokolov et al. |
| 2008/0158958 A1 | 7/2008 | Shalvi et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0201620 A1 | 8/2008 | Gollub |
| 2008/0209114 A1 | 8/2008 | Chow et al. |
| 2008/0219050 A1 | 9/2008 | Shalvi et al. |
| 2008/0225599 A1 | 9/2008 | Chae |
| 2008/0250195 A1 | 10/2008 | Chow et al. |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0027961 A1 | 1/2009 | Park et al. |
| 2009/0043951 A1 | 2/2009 | Shalvi et al. |
| 2009/0046507 A1 | 2/2009 | Aritome |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1 | 5/2009 | Flynn et al. |
| 2009/0132755 A1 | 5/2009 | Radke |
| 2009/0144598 A1 | 6/2009 | Yoon et al. |
| 2009/0144600 A1 | 6/2009 | Perlmutter et al. |
| 2009/0150599 A1 | 6/2009 | Bennett |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2009/0282185 A1 | 11/2009 | Van Cauwenbergh |
| 2009/0282186 A1 | 11/2009 | Mokhlesi et al. |
| 2009/0287930 A1 | 11/2009 | Nagaraja |
| 2009/0300269 A1 | 12/2009 | Radke et al. |
| 2009/0323942 A1 | 12/2009 | Sharon et al. |
| 2010/0005270 A1 | 1/2010 | Jiang |
| 2010/0025811 A1 | 2/2010 | Bronner et al. |
| 2010/0030944 A1 | 2/2010 | Hinz |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0172179 A1 | 7/2010 | Gorobets et al. |
| 2010/0174853 A1 | 7/2010 | Lee et al. |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0241793 A1 | 9/2010 | Sugimoto et al. |
| 2010/0246265 A1 | 9/2010 | Moschiano et al. |
| 2010/0251066 A1 | 9/2010 | Radke |
| 2010/0253555 A1 * | 10/2010 | Weingarten ......... G06F 11/1068 341/51 |
| 2010/0257309 A1 | 10/2010 | Barsky et al. |
| 2010/0269008 A1 | 10/2010 | Leggette et al. |
| 2010/0293321 A1 | 11/2010 | Weingarten |
| 2010/0318724 A1 | 12/2010 | Yeh |
| 2011/0051521 A1 | 3/2011 | Levy et al. |
| 2011/0055461 A1 | 3/2011 | Steiner et al. |
| 2011/0093650 A1 | 4/2011 | Kwon et al. |
| 2011/0096612 A1 | 4/2011 | Steiner et al. |
| 2011/0099460 A1 | 4/2011 | Dusija et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0194353 A1 | 8/2011 | Hwang et al. |
| 2011/0209028 A1 | 8/2011 | Post et al. |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |

(56) References Cited

U.S. PATENT DOCUMENTS

| | | |
|---|---|---|
| 2012/0008401 A1 | 1/2012 | Katz et al. |
| 2012/0008414 A1 | 1/2012 | Katz et al. |
| 2012/0017136 A1 | 1/2012 | Ordentlich et al. |
| 2012/0051144 A1 | 3/2012 | Weingarten et al. |
| 2012/0063227 A1 | 3/2012 | Weingarten et al. |
| 2012/0066441 A1 | 3/2012 | Weingarten |
| 2012/0110250 A1 | 5/2012 | Sabbag et al. |
| 2012/0124273 A1 | 5/2012 | Goss et al. |
| 2012/0246391 A1 | 9/2012 | Meir et al. |

OTHER PUBLICATIONS

Search Report of PCT Patent Application WO 2009/095902 A3, Mar. 4, 2010.
Search Report of PCT Patent Application WO 2009/078006 A3, Mar. 4, 2010.
Search Report of PCT Patent Application WO 2009/074979 A3, Mar. 4, 2010.
Search Report of PCT Patent Application WO 2009/074978 A3, Mar. 4, 2010.
Search Report of PCT Patent Application WO 2009/072105 A3, Mar. 4, 2010.
Search Report of PCT Patent Application WO 2009/072104 A3, Mar. 4, 2010.
Search Report of PCT Patent Application WO 2009/072103 A3, Mar. 4, 2010.
Search Report of PCT Patent Application WO 2009/072102 A3, Mar. 4, 2010.
Search Report of PCT Patent Application WO 2009/072101 A3, Mar. 4, 2010.
Search Report of PCT Patent Application WO 2009/072100 A3, Mar. 4, 2010.
Search Report of PCT Patent Application WO 2009/053963 A3, Mar. 4, 2010.
Search Report of PCT Patent Application WO 2009/053962 A3, Mar. 4, 2010.
Search Report of PCT Patent Application WO 2009/053961 A3, Mar. 4, 2010.
Search Report of PCT Patent Application WO 2009/037697 A3, Mar. 4, 2010.
Yani Chen, Keshab K. Parhi, "Small Area Parallel Chien Search Architectures for Long BCH Codes", Ieee Transactions On Very Large Scale Integration (VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, pp. II-369-72 vol. 2.
Michael Purser, "Introduction To Error Correcting Codes", Artech House Inc., 1995.
Ron M. Roth, "Introduction to Coding Theory", Cambridge University Press, 2006.

Akash Kumar, Sergei Sawitzki, "High-Throughput and Low Power Architectures for Reed Solomon Decoder", (a.kumar at tue.nl, Eindhoven University of Technology and sergei.sawitzki at philips. com), Oct. 2005.
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions On Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built In Self Diagnosis", ITC International Test Conference, Paper 2.1, Feb. 2005.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, "Data retention prediction for modern floating gate non-volatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com, 2005.
Paulo Cappelletti, Clara Golla, Piero Olivo, Enrico Zanoni, "Flash Memories", Kluwer Academic Publishers, 1999.
JEDEC Standard, "Stress-Test-Driven Qualification of Integrated Circuits", JEDEC Solid State Technology Association. JEDEC Standard No. 47F pp. 1-26, Dec. 2007.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.

\* cited by examiner

SYSTEM AND METHOD FOR MULTIPLE DIMENSION DECODING AND ENCODING A MESSAGE

BACKGROUND

ECC—Error-Correction-Coding is a process by which additional redundant information is appended to a message in order to render the message resilient to errors inflicted on it in the process of transmission and reception or equivalently, during storage and retrieval. This additional information is called the "redundancy". There are many various ways and algorithms to derive the redundancy, the exact algorithm is not pertinent to this invention, it is enough to note, that the redundancy is computed by the encoder from all of the message's bits.

In the decoder a reverse process occurs, the erroneous message with the redundancy is received and inspected. The errors are identified and fixed (if possible), the redundancy is stripped from the message, and the recovered message is passed to the client.

FIG. 1 illustrates a prior art ECC encoding and ECC decoding process. A message 11 (illustrated as having content 0100111 . . . 1011010) is partitioned into packets m1, m2 . . . mN (collectively denoted 21) that are fed to the first encoder 13(1). The first encoder 13(1) computes redundancies r1, r1, r2 . . . RN (collectively denoted R1 21) for each packet which are appended ("append redundancy") 14 to the message to provide an encoded message 15. Encoded message 15 is illustrated as having content "0100111 . . . 1011010 . . . 0110" and includes packets m1, m2 . . . mN and redundancies r1, r2 . . . rN.

The encoded message 15 is transmitted or stored in the "error inflicting" channel or media 16 to provide an error containing message 17 {m1, m2 . . . Mn, r1 . . . rN}+{e} (illustrated as having content (0101111 . . . 1010010 . . . 00000). The error containing message 17 is received by the first decoder 18(1). The first decoder 18(1) identifies and fixes the errors if possible. Redundancies are stripped from the data and a recovered message 19 including recovered (error corrected) packets {m1', m2', . . . mN'} is fed to the client.

Multi-Dimensional ECC

In a simple case messages i.e. packets are serially fed to the encoder, transmitted, received, and recovered, all in a serial manner. But In order to improve error correction capability it is common to partition the large message into some collection of smaller packets i.e. into a successive series {m1, m2 . . . mN}, then calculate redundancies for each of them i.e. {r11, r12 . . . r1N}, then partition the data again in some other different permutation {n1, n2 . . . nN} (It is possible to have different number of packets in each dimension, i.e. N and K for example in the 2 dimensional case), and compute redundancies for this collection also i.e. {r21, r22 . . . r2N} etc. . . . and repeat this process N times to produce an N dimensional ECC system.

In order to facilitate understanding and simplify the drawings (without any loss of generality) the following explanations will refer to a two-dimensional ECC encoding.

In essence, each bit is encoded in two different packets, which is simply means that each bit participates in the calculation of 2 redundancies one in each "dimension" as described previously for a single dimension. The redundancies then appended to the message and transmitted in a communication system (or stored in a storage system).

For demonstration and simplicity FIG. 2 depicts a pair of encoders that execute two dimensional encoding so that each bit of the message is decoded twice.

First encoder 13(1) gets the original message 11 in order and generates a redundancy (collectively denoted R1 20(1)) for each of the packets m1, m2 . . . mN.

Second encoder 13(2) receives the message after it was reordered in some different permutation, i.e. the second encoder 13(2) gets a different series of packets n0, n1 and generates redundancy (collectively denoted R2 20(2)) for packets n1, n2 . . . nN Because the encoding is two dimensional—each bit of the message belongs both to some packet 'm' in the first dimension and one packet 'n' of a second dimension.

To better understand the partition of the message, consider FIG. 3. It depicts the partitioning of message 11 into packets m1 . . . mN 21(1)-21(N). The first dimension simply partitions the data "in order" successively into each appropriate packet.

In contrast—second encoder 13(2) gets a different set of packets i.e. n1, n2 . . . nN (denoted 22(1)-22(N) in FIG. 4) where each successive byte of a packet resides elsewhere in the original data according to some permutation.

Another different and popular representation of the data partitioning and permutation is depicted in an "interleaving diagram", this depiction also assumes a known and popular permutation. The permutation is achieved using a two dimensional shift register. For simplicity of explanation it is assumed that the shift register is an N*N shift register—thus there are N packets on each dimension—which is only an example as the number of packets per one dimension may differ from a number of packets of another dimension leading to a non-rectangular shift register. FIGS. 6A and 6B depict this permutation, the original message 11 is depicted as being a stream of successive $N^2$ bytes of data numbered by the order of arrival 1 . . . . $N^2$ 11(1)-11($N^2$). Wherein $N^2$ means N by the power of two.

This successive stream is fed into a two dimensional shift register 30 having $N^2$ by $N^2$ cells—to form $N^2$ columns and $N^2$ rows. Each cell of the 2 dimensional shift register is marked with its byte number (with respect to the arrival order—illustrated by dashed line 34).

When the shift register is full, data is shifted out horizontally into the second encoder 13(2) (FIG. 2) to form the n1 . . . nN packets 22(1)-22(N), and also shifted vertically into the first encoder 13(1) to form packets m1, m2 mN.

FIGS. 3 and 4 show packets m1 and n1 22(1) and 21(1) respectively and exemplify their byte composition.

On-the-Fly or Streaming/not-Buffered Operation

It is advantageous to design a system that doesn't require buffering all of the data prior to the beginning of encoding. It is much better in terms of latency to start computation at the moment the first byte of the original data arrives, yet it is clear that for example for packet n1 (denoted 22(1) in FIGS. 6A and 6B) the encoder will stall while waiting for byte N+1 (while bytes 2, 3, 4 . . . N are fed to the encoder), which comes right after byte 1 as the second byte of packet 22(1). In the meantime packets n2, n3 . . . are also stalled while the encoder is waiting for the next byte of packet n1.

This latency problem can be solved by employing N encoders as depicted in FIG. 5 encoders 13(1)-13(N−1)—wherein the number of encoders equals the number of packets in the message. First encoder 13(1) starts computation as byte #1 arrives, than stalls until byte #(N+1) (which is the 2nd byte of packet n1) arrives, second encoder 13(2) starts as byte #2 is available etc. . . . .

Note that each encoder retains its state as each one is dedicated for each of the packets.

This solution is expensive, hard to configure and inappropriate for some applications.

SUMMARY

Methods and systems are provided for multi-dimensional encoding/decoding.

There may be provided according to an embodiment of the invention a method for multiple dimensional encoding of a message, the method comprises repeating, for each data unit that belongs to the message the stages of: (a) receiving by a processor the data unit; (b) executing by the processor, for each dimension of a plurality of dimensions of the multiple dimension, the stages of: (b.1) restoring a last state of an encoder during an encoding process of a packet that comprises the data unit, wherein the encoding process corresponds to the dimension; (b.2) encoding the data unit by the encoder in correspondence to the dimension to provide an updated state of the encoder; and (b.3) storing the updated state of the encoder as a last state of the encoder; wherein the updated state of the encoder following the encoding of all data units of the message represents redundancy bits; and (c) adding the redundancy bits to the message to provide a multiple dimensional encoded message.

The plurality of dimensions is a subset of the multiple dimensions.

The method may include decoding, for a residual dimension that belongs to the multiple dimensions and does not belong to the plurality of dimensions, all data units that form the message in a sequential manner by a residual encoder allocated to the residual dimension without restoring the last state of the residual encoder at a memory unit that differs from the encoder.

The method may include encoding data units of the message in correspondence to each of the plurality of dimensions by a same encoder.

The method may include encoding data units of the message in correspondence to different dimensions of the plurality of dimensions by different encoders.

The encoding may include error correction encoding of the data unit.

The receiving of the data unit comprises storing the data unit by a memory that has a size that is smaller than a size of the message.

There may be provided according to an embodiment of the invention a system that includes a memory and a processor. The memory may be arranged to receive a data unit. The processor may be arranged to execute, for each dimension of a plurality of dimensions of the multiple dimension, the stages of (a) restoring from the memory a last state of an encoder during an encoding process of a packet that comprises the data unit, wherein the encoding process corresponds to the dimension, and (b) encoding the data unit by the encoder in correspondence to the dimension to provide an updated state of the encoder. The memory may be arranged to store the updated state of the encoder as a last state of the encoder; wherein the updated state of the encoder following the encoding of all data units of the message represents redundancy bits. The processor may be arranged to add the redundancy bits to the message to provide a multiple dimensional encoded message.

The plurality of dimensions may be a subset of the multiple dimensions.

The processor may be arranged to decode, for a residual dimension that belongs to the multiple dimensions and does not belong to the plurality of dimensions, all data units that form the message in a sequential manner by a residual encoder allocated to the residual dimension without restoring the last state of the residual encoder at a memory unit that differs from the encoder.

The processor may be arranged to encode data units of the message in correspondence to each of the plurality of dimensions by a same encoder.

The processor may be arranged to encode data units of the message in correspondence to different dimensions of the plurality of dimensions by different encoders.

The processor may be arranged to perform error correction encoding of the data unit.

The memory may have a size that is smaller than a size of the message.

There may be provided according to an embodiment of the invention a method for multiple dimensional decoding of a decoded message, the method may include repeating, for each decoded data unit that belongs to the decoded message the stages of: (a) receiving by a processor the decoded data unit; (b) executing by the processor, for each dimension of a plurality of dimensions of the multiple dimension, the stages of: (b.1) restoring a last state of an decoder during an encoding process of a decoded packet that comprises the decoded data unit, wherein the decoding process corresponds to the dimension; (b.2) decoding the decoded data unit by the decoder in correspondence to the dimension to provide an updated state of the decoder; and (b.3) storing the updated state of the decoder as a last state of the encoder; wherein the updated state of the encoder following the encoding of all data units of the message represents redundancy bits; and (c) adding the redundancy bits to the message to provide a multiple dimensional encoded message.

There may be provided according to an embodiment of the invention a system for multiple dimensional decoding of a decoded message, the system may include a memory and a processor; wherein the memory may be arranged to store a decoded message; wherein the processor may be arranged to repeat, for each decoded data unit that belongs to the decoded message: receive the decoded data unit; execute for each dimension of a plurality of dimensions of the multiple dimension, the stages of: restoring a last state of an decoder during an encoding process of a decoded packet that comprises the decoded data unit, wherein the decoding process corresponds to the dimension; decoding the decoded data unit by the decoder in correspondence to the dimension to provide an updated state of the decoder; and storing the updated state of the decoder as a last state of the encoder. The updated state of the encoder following the encoding of all data units of the message represents redundancy bits. The processor may be further arranged to add the redundancy bits to the message to provide a multiple dimensional encoded message.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
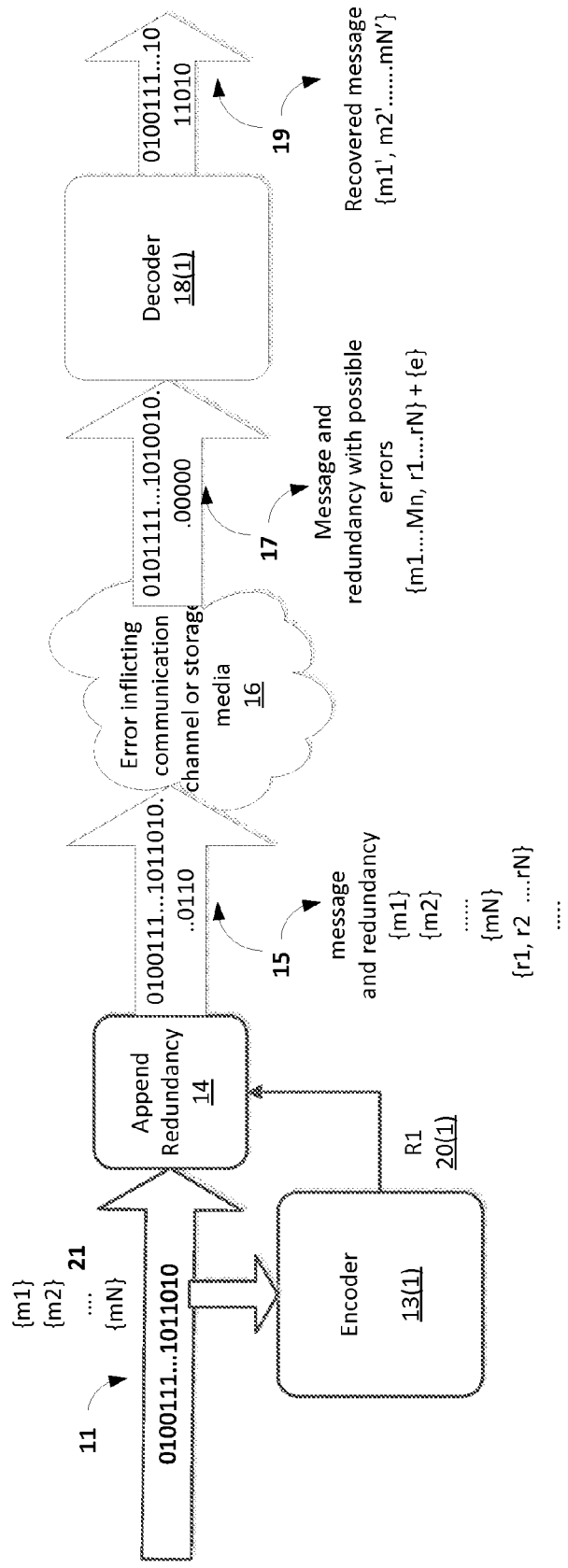
FIG. 1 illustrates a prior art single dimension ECC encoding and an ECC decoding process.
Figure 2:
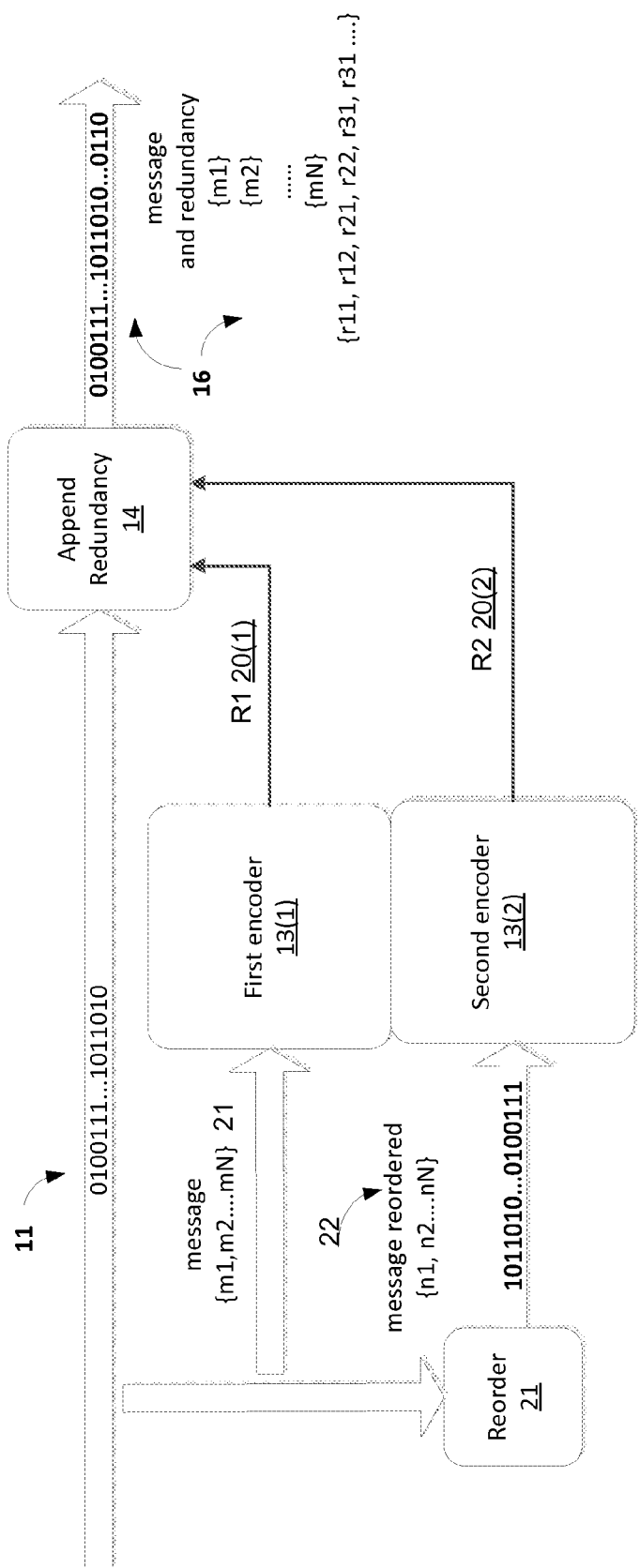
FIG. 2 illustrates a prior art two dimensional ECC encoding process.
Figure 3:
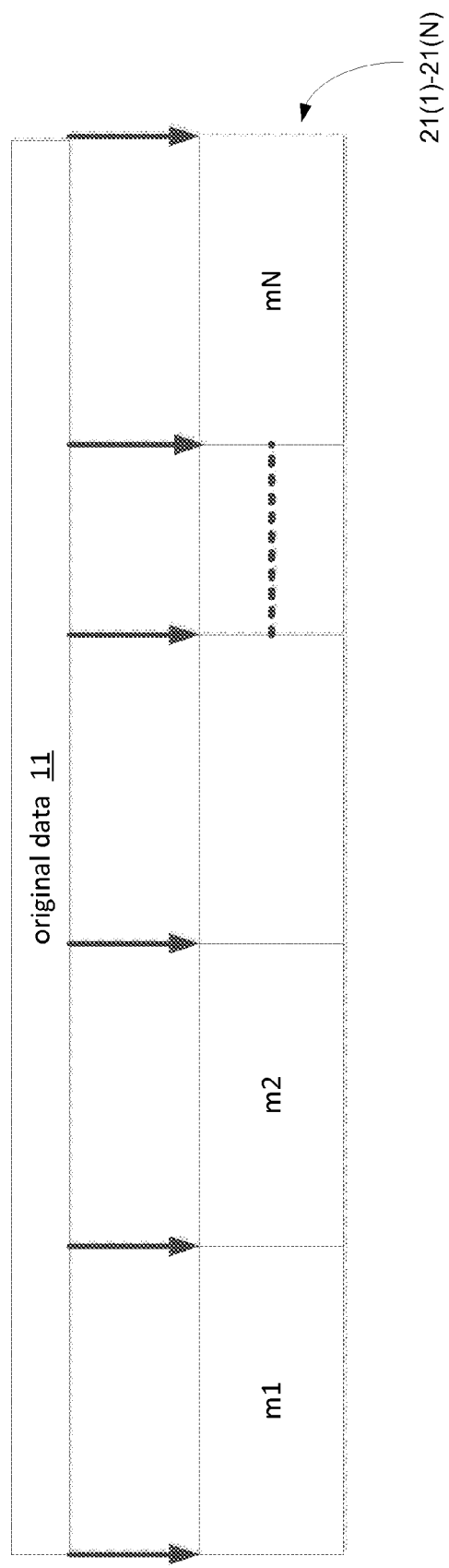
FIG. 3 illustrates a prior art partition of a message to packets according to a first permutation.
Figure 4:
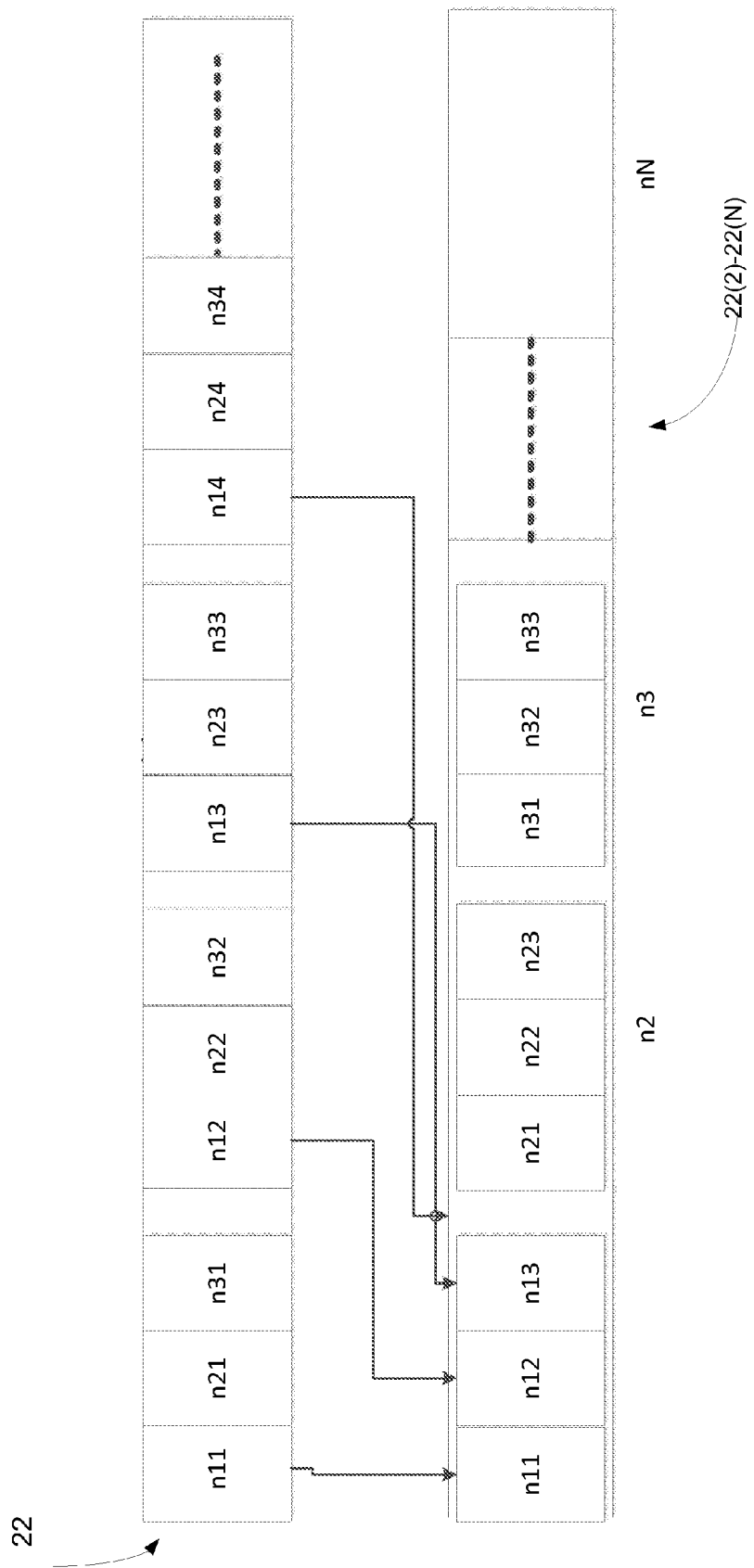
FIG. 4 illustrates a partition of a message to packets according to a second permutation (second order)
Figure 5:
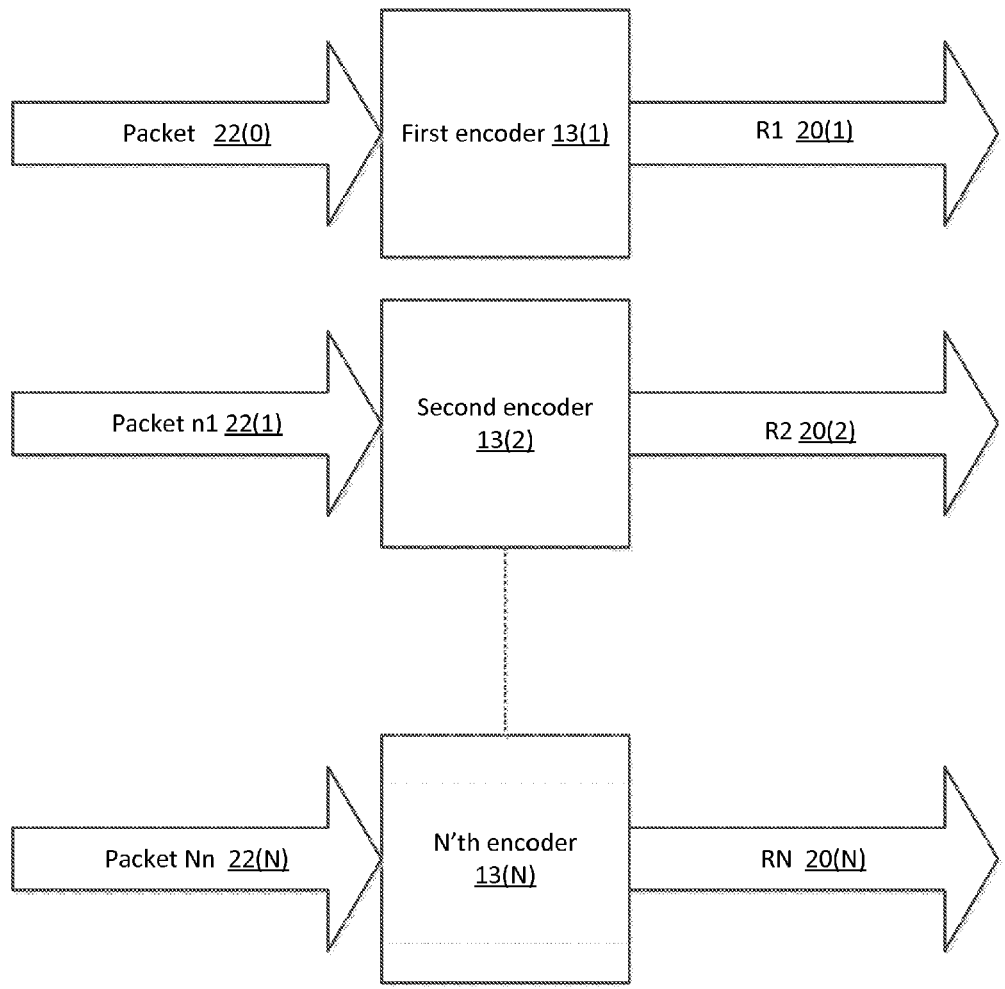
FIG. 5 illustrates a prior art ECC encoding process that used N prior art encoders, N being a number of packets per message.
Figure 6A:
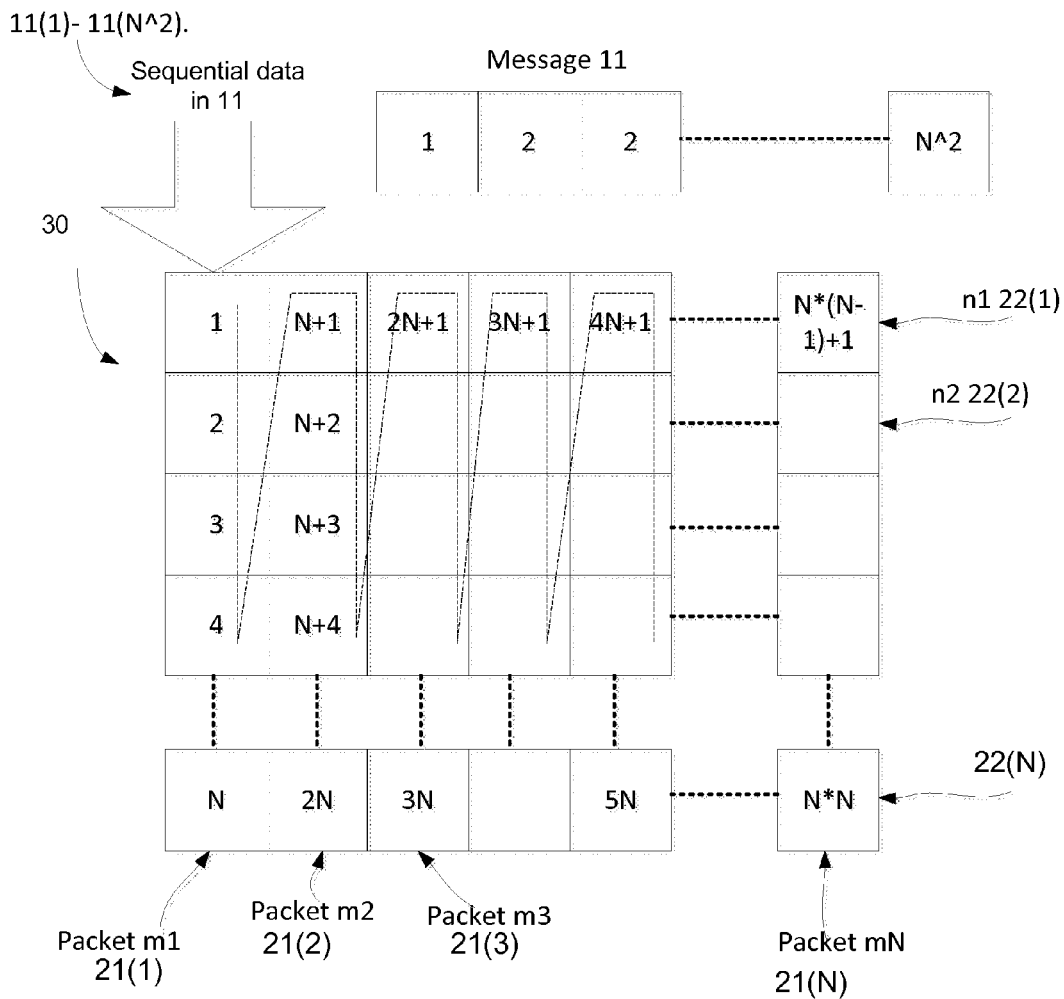
FIGS. 6A and 6B illustrate a packet and a prior art two dimensional shift register that facilitates a partition of a message to packets according to first and second permutations (first and second orders)
Figure 6B:
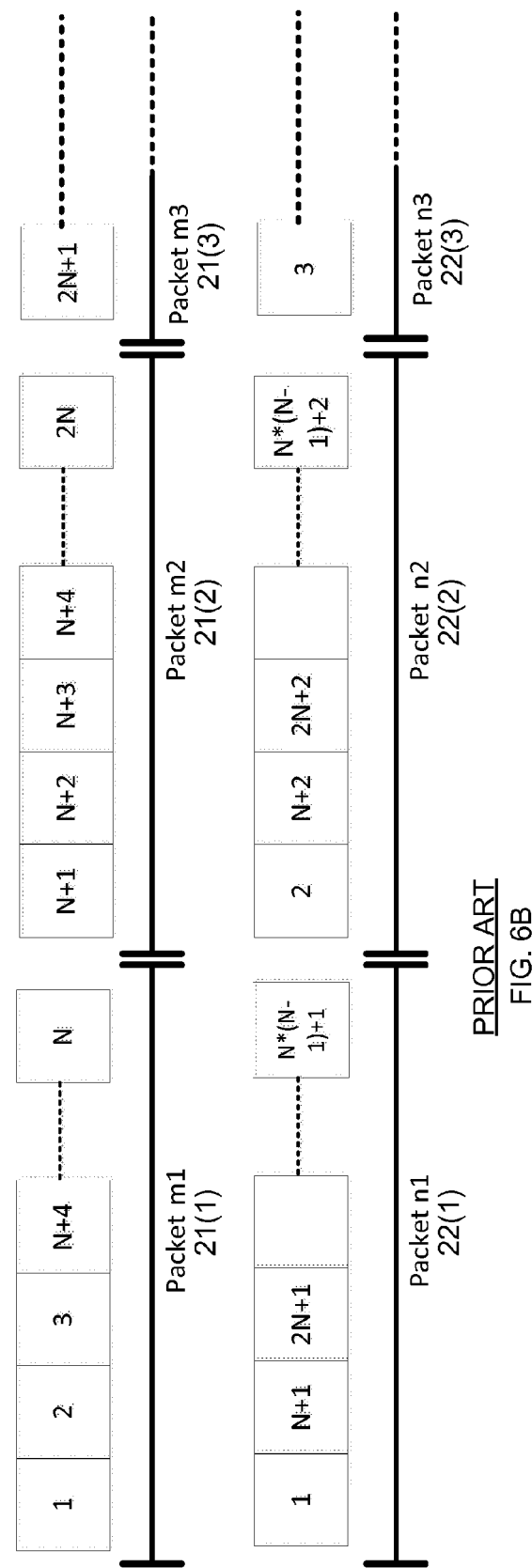

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method.

Any reference in the specification to a system should be applied mutatis mutandis to a method that may be executed by the system.

Any reference to an encoding process or to an encoder can be applied mutatis mutandis to a decoding process or to a decoder.

The term data unit may include one or multiple bits. The data unit may have any size and is not limited to a byte. Multiple data units may form a packet.

The term message refers to a group of data bits. The message may include multiple packets that in turn may include multiple data units.

There is provided a cost effective un-buffered (on-the-fly) multidimensional ECC both in encoder and decoder. The term un-buffered indicates that there is no need to buffer the entire message although small data units (fractions of the message) may be stored.

There is provided a system that utilizes less decoder or encoder subunits than the number of packets per message. An encoder can be allocated per each dimension or for more than a single dimension of a multiple encoding scheme. A decoder can be allocated per each dimension or for more than a single dimension of a multiple dimension ECC scheme.

The system may include (a) an encoder, (b) a memory where the state of the encoder for each packet can be stored, and (c) a memory-read and memory-write logic that saves and restores the encoder state for the next packet in the queue.

Figure 7:
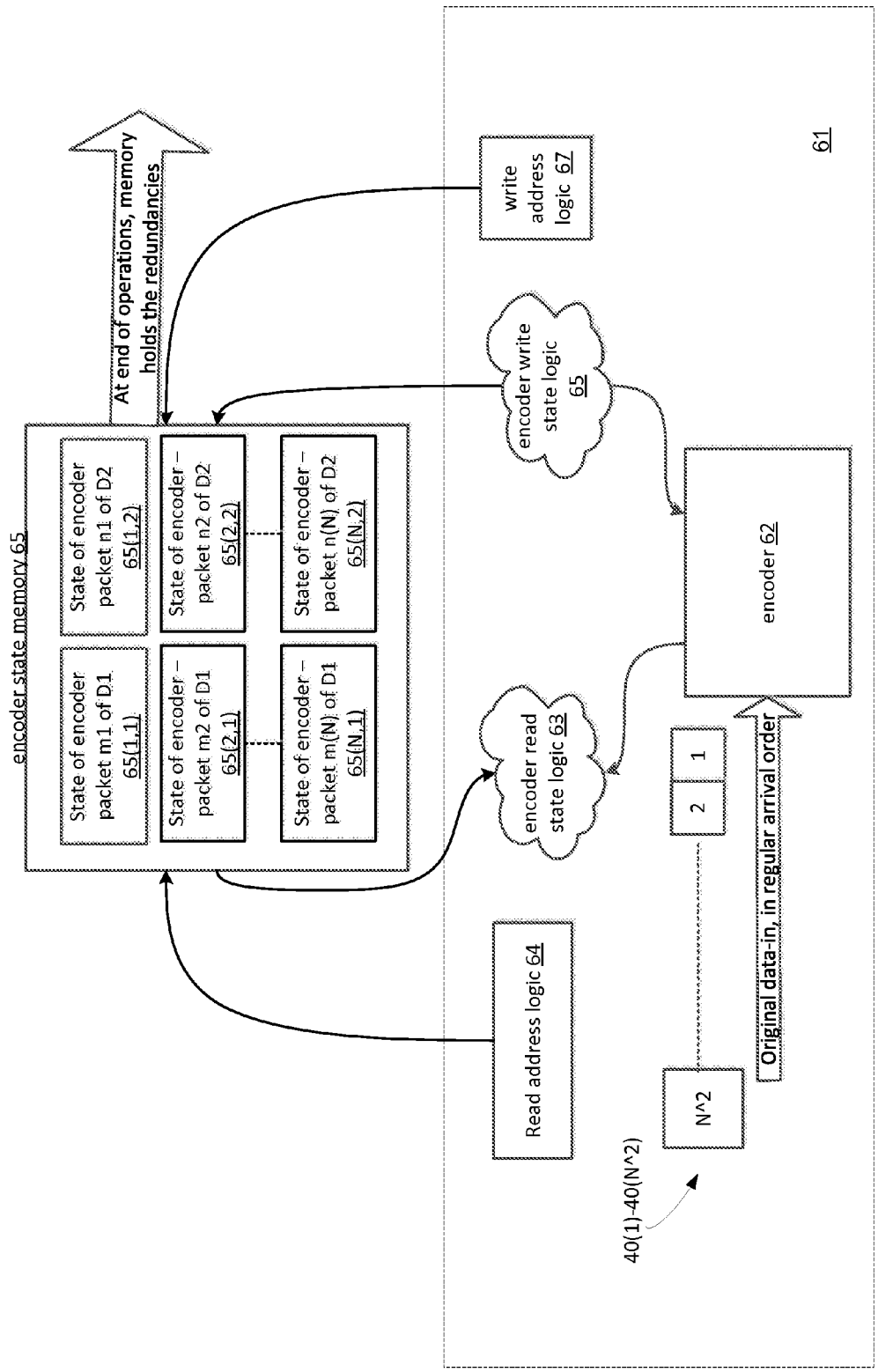
FIG. 7 illustrates a system for ECC encoding according to an embodiment of the invention.
Figure 8:
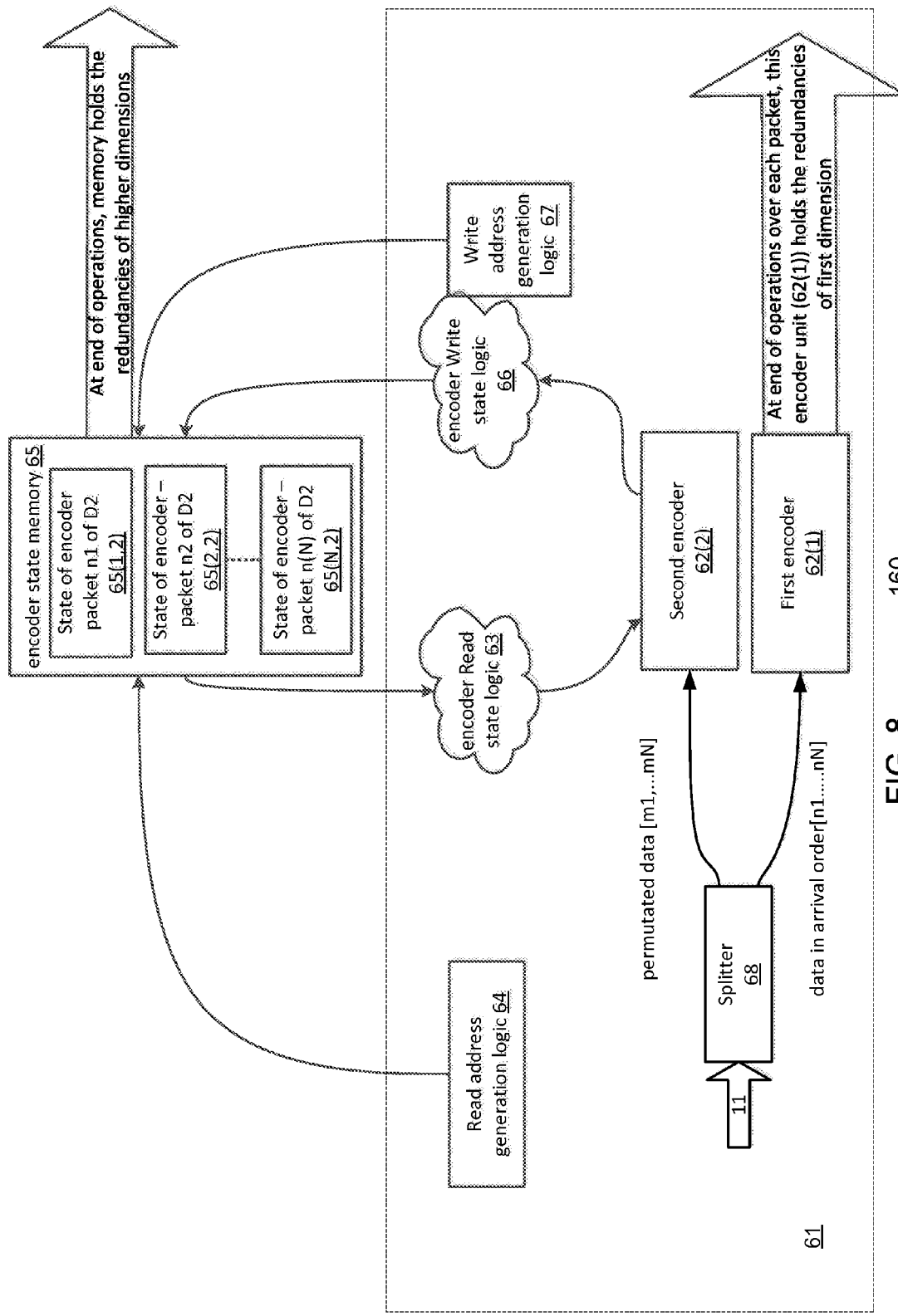
FIG. 8 illustrates a system for ECC encoding according to an embodiment of the invention.
Figure 9:
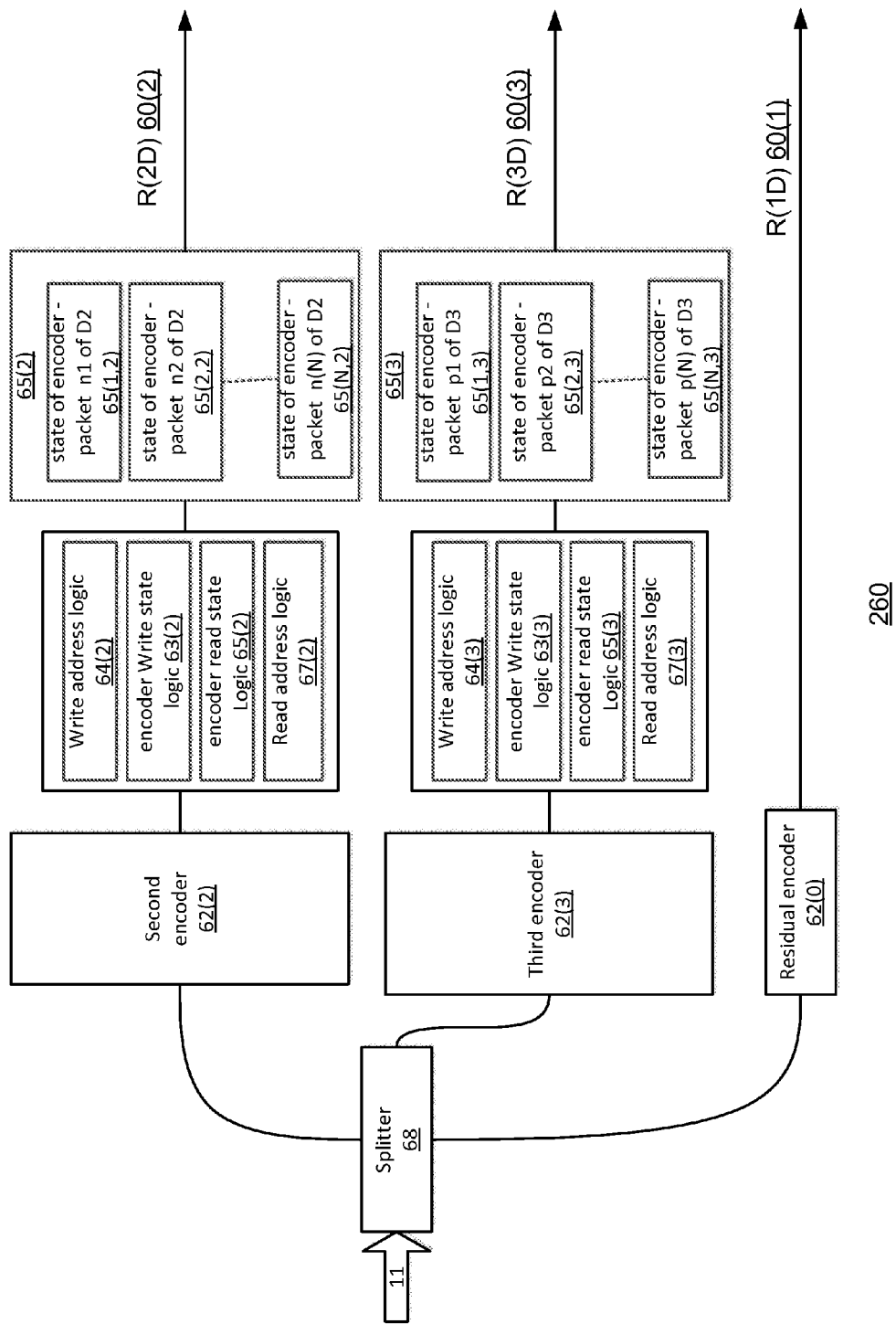
FIG. 9 illustrates a system for ECC encoding according to an embodiment of the invention.

FIG. 7 illustrates a system 60 for ECC encoding according to an embodiment of the invention. FIG. 8 illustrates a system 160 for ECC encoding according to an embodiment of the invention. FIG. 9 illustrates a system 260 for ECC encoding according to an embodiment of the invention.

Each one of these systems may be arranged to perform multiple dimensional encoding of multiple (K) dimensions. In FIGS. 7 and 8 the systems 60 and 160 are illustrated as being arranged to perform a two dimensional encoding (K=2) and in FIG. 9 the system 260 may be arranged to perform a three-dimensional encoding (K=3) but this is only an example. For example, system 60 may perform multiple dimensional encoding for three or more dimensions—but will require storing the state of the encoder for each data unit of the third and above dimensions. Each encoder in either of these figures can be arranged to perform encoding of a dimension, of a part of a dimension or of more than a single dimension.

According to an embodiment of the invention each combination of encoder, memory and read and write logic engine, can perform an encoding of a single dimension while operating in the same rate of the system.

In any case the encoding rate of the system should not be substantially lower than the reception rate of the message—in order to prevent the need of large buffers for compensating for rate mismatches. Thus—an encoder that is expected to encode each data unit at more than a single dimension should be faster than an encoder that may be arranged to perform only a single dimension encoding process.

Referring to FIG. 7—system 60 includes memory (encoder state memory 65) and processor 61. The processor 61 may include the memory 65.

The processor 61 includes encoder 62, encoder write state logic 63, read generation address logic 64, encoder write state logic 66 and write address logic 67.

Data units 40(1)-40(N*N) of a message 11 arrive in a regular order 1, 2 .... N*N, each successive data unit belongs to K packets—one packet per dimension. The packets of the first dimension (D1) are denoted m1 ... mN, the packets of the second dimension (D2) are denoted n1 ... nN. In FIG. 9 the packets of the third dimension (D3) are denoted p1 ... pN.

Whenever a data unit arrives the following process is applied (for example in a sequential manner) for each of the two dimensions—D1 and D2—the read address logic 63 and 64 sends to the memory 65 the address of the encoder state as it was at the time it finished computing the previous data unit of the same packet of the same dimension and the encoder read state logic 63 receives this so called last state and feeds it to the encoder engine subunit 62.

The encoder 62 computes the next state for that packet of the same dimension, and the result is stored back in the memory in the appropriate location for this packet of the same dimension (same location), and prior to the arrival of next data unit of the next successive packet of either one of the dimensions. The write address logic 67 sends to the memory 65 an address in which this state is stored and the write address logic 64 sends that state to that address.

For the first dimension—the states of the encoder are denoted "state of encoder packet m1 of D1"—"state of encoder packet mN of D1" 65(1,1)-65(N,1). For the second dimension—the states of the encoder are denoted "state of encoder packet n1 of D2"—"state of encoder packet nN of D2" 65(1,2)-65(N,2).

This iterative process is executed for each received data unit and for each dimension and does not require waiting till the entire message is received. At the end of this iterative process the memory 65 stores redundancy bits that can be read and appended to the transmitted (or stored) message.

FIG. 8 illustrates system 160 that differs from system 60 by having (instead of a single encoder 62) a second encoder 62(2) for encoding packets of the second dimension and a residual encoder 62(1) for encoding the packets m1 . . . mN of the first dimension. FIG. 8 also illustrates splitter 68 for feeding received data units to all of the encoders.

The residual encoder 62(1) encodes the data units according to their reception order without re-arranging the data unit. Second encoder engine 62(1) maintains its state from data unit to data unit for the duration of the whole packet (each of m1 . . . mN). It produces redundancies ready to be transmitted for each packet at the end of each packet.

The second encoder 62(2) is coupled to memory 65 via encoder read state logic 53, read address logic 64, encoder write state logic 66 and write address logic 67. Memory 65 is used to store the state of second encoder 62(2) only in relation to packets n1 . . . nN of the second dimension.

The second encoder 62(2) computes the next state for that packet of D2, and the result is stored back in the memory in the appropriate location for this packet of D2, and prior to the arrival of next data unit of the next successive packet of D2. The write address logic 66 sends to the memory 65 an address in which this state is stored and the write address logic 67 sends that state to that address.

FIG. 9 illustrates system 260 that differs from system 60 by having (instead of a single encoder 62) a third encoder 62(3) for encoding packets of the third dimension, a second encoder 62(2) for encoding packets of the second dimension and a residual encoder 62(1) for encoding the packets m1 . . . mN of the first dimension. FIG. 9 also illustrates splitter 68 for feeding received data units to all of the encoders.

System 260 also differs from system 60 by having (instead of a memory 65) memory 65(2) and memory 65(3).

The residual encoder 62(1) encodes the data units according to their reception order without re-arranging the data units, without storing the state of the encoder after each encoding of a data unit and retrieving the state of the encoder after the encoding of each data unit.

The second encoder 62(2) is coupled to memory 65(2) via encoder write state logic 63(2), write address logic 64(2), encoder read state logic 66(2) and read address logic 67(2). Memory 65(2) is used to store the state of second encoder 62(2) only in relation to packets n1 . . . nN of the second dimension.

The second encoder 62(2) computes the next state for that packet of D2, and the result is stored back in the memory 65(2) in the appropriate location for this packet of D2, and prior to the arrival of next data unit of the next successive packet of D2. The write address logic 64(2) sends to the memory 65(2) an address in which this state is stored and the write address logic 64(2) sends that state to that address.

The third encoder 62(3) is coupled to memory 65(3) via encoder write state logic 63(3), write address logic 64(3), encoder read state logic 66(3) and read address logic 67(3). Memory 65(3) is used to store the state of third encoder 62(3) only in relation to packets p1 . . . pN of the third dimension D3.

The third encoder 62(3) computes the next state for that packet of D3, and the result is stored back in the memory 65(3) in the appropriate location for this packet of D3, and prior to the arrival of next data unit of the next successive packet of D3. The write address logic 64(3) sends to the memory 65(3) an address in which this state is stored and the write address logic 64(3) sends that state to that address.

These systems obviate the need for data buffering and the requirement to stall the encoder in the anticipation for the next non-successive data unit of the packet according to the permutation used—hence latency is optimally minimized.

In should be noted that even though the description was for an encoder that generates redundancy, in the decoder the same architecture can be employed to calculate the syndromes.

Any permutation scheme (between data units and packets) can be used a not only the simplest as in the above example. Implementing any rational permutation scheme requires only changes to the logic that calculates the next-read/write address pointers that write or restore encoder/decoder states from memory for each packet (labels 4, 6).

The system is supremely configurable, and the configuration range is limited only by the size of the state-memory (which is small and varies with number of packets, not the data—hence cheaply enlarged). Systems 60, 160 can apply any error correction algorithm, such as but not limited to BCH error correction algorithm. The message and the redundancy bits can be sent to a flash memory module and the message with the possible errors and redundancy bits can be read from a flash memory module.

Typically the number of dimensions K is much smaller that the number N of packets per message, non-limiting values of these variables are K=3, N1=8, N2=48, N3=50 (an example of one typical codes we have, the parameters N1, N2, N3 are number of packets in each dimension, they may differ from each other).

Each dimension may be a T error correction BCH with a freely configurable number of packets per dimension.

Figure 11:
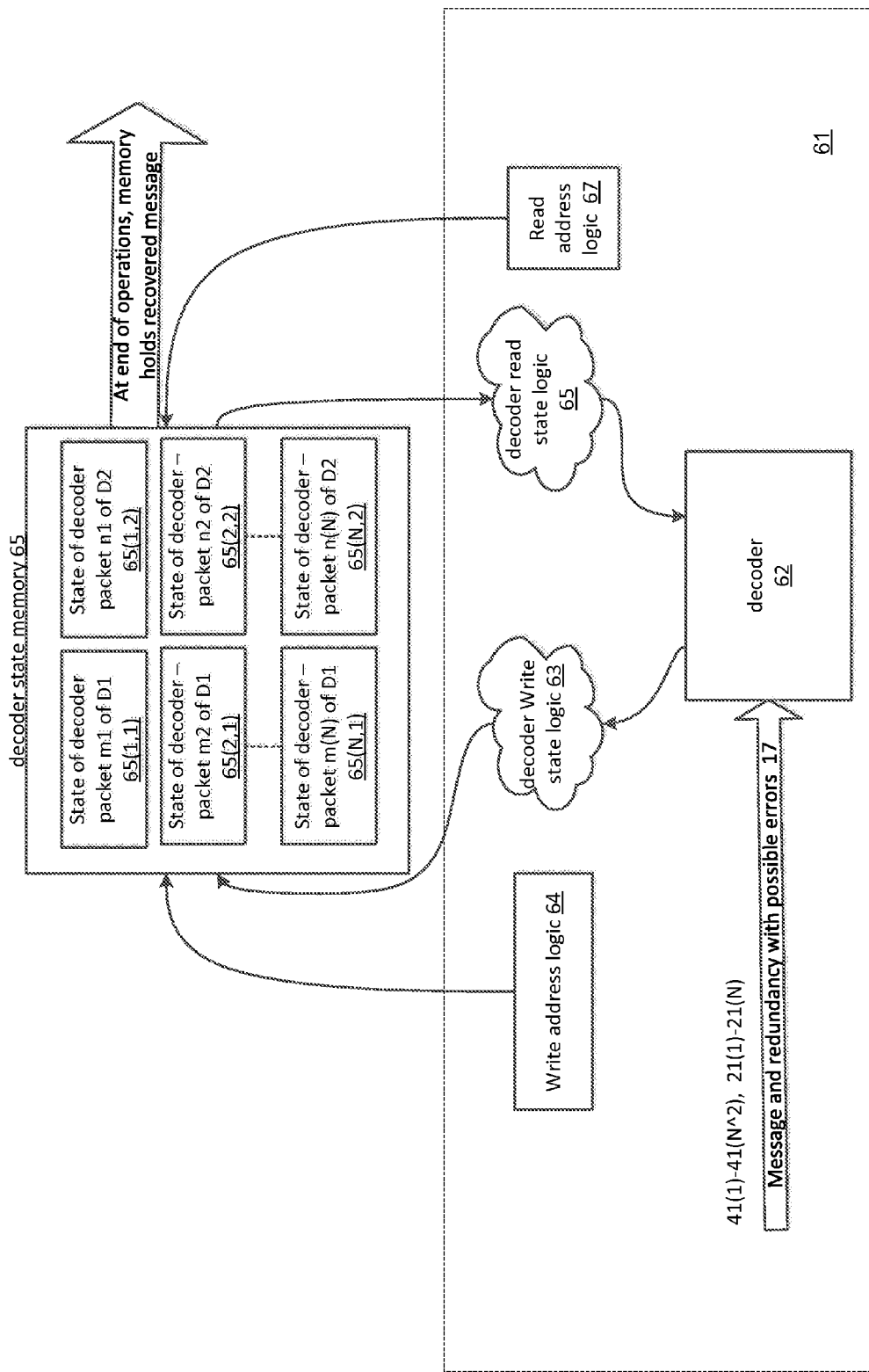
FIG. 11 illustrates a system for ECC decoding according to an embodiment of the invention.

FIG. 11 illustrates a system 60 for ECC decoding according to an embodiment of the invention.

System 60 includes memory (decoder state memory 65) and processor 61. The processor 61 may include the memory 65.

The processor 61 includes decoder 62, decoder write state logic 63, write address logic 64, decoder read state logic 65 and read address logic 67. The processor 61 includes one or more hardware components.

Data units **40(1)-40(N*N) and redundancy R(1)-R(N) 21(1)-21(N) with possible errors (collectively denoted 17 in FIG. 1**) arrive in a regular order—wherein each successive data unit belongs to K packets—one packet per dimension. The packets of the first dimension (D1) are denoted m1 . . . mN, the packets of the second dimension (D2) are denoted n1 . . . nN.

Whenever a data unit arrives the following process is applied (for example in a sequential manner) for each of the two dimensions—D1 and D2—the read address logic 67 sends to the memory 65 the address of the decoder state as it was at the time it finished computing the previous data unit of the same packet of the same dimension and the decoder read state logic 65 receives this so called last state and feeds it to the decoder 62.

The decoder 62 computes the next state for that packet of the same dimension, and the result is stored back in the memory in the appropriate location for this packet of the same dimension, and prior to the arrival of next data unit of the next successive packet of either one of the dimensions. The write address logic 64 sends to the memory 65 an address in which this state is stored and the write address logic 64 sends that state to that address.

For the first dimension—the states of the decoder are denoted "state of decoder packet m1 of D1"—"state of decoder packet mN of D1" 65(1,1)-65(N,1). For the second dimension—the states of the decoder are denoted "state of decoder packet n1 of D2"—"state of decoder packet nN of D2" 65(1,2)-65(N,2).

This iterative process is executed for each received data unit and for each dimension and does not require waiting till the entire message is received. At the end of this iterative process the memory 65 stores a reconstructed message.

The states of the encoder can be the redundancies that are appended to the transmitted packet similar to CRC. The states in the decoder are also referred to as syndromes and they may be used to construct the equation that need to be solved in order to find the errors (the errors are the roots of the aforementioned equations).

Figure 10:
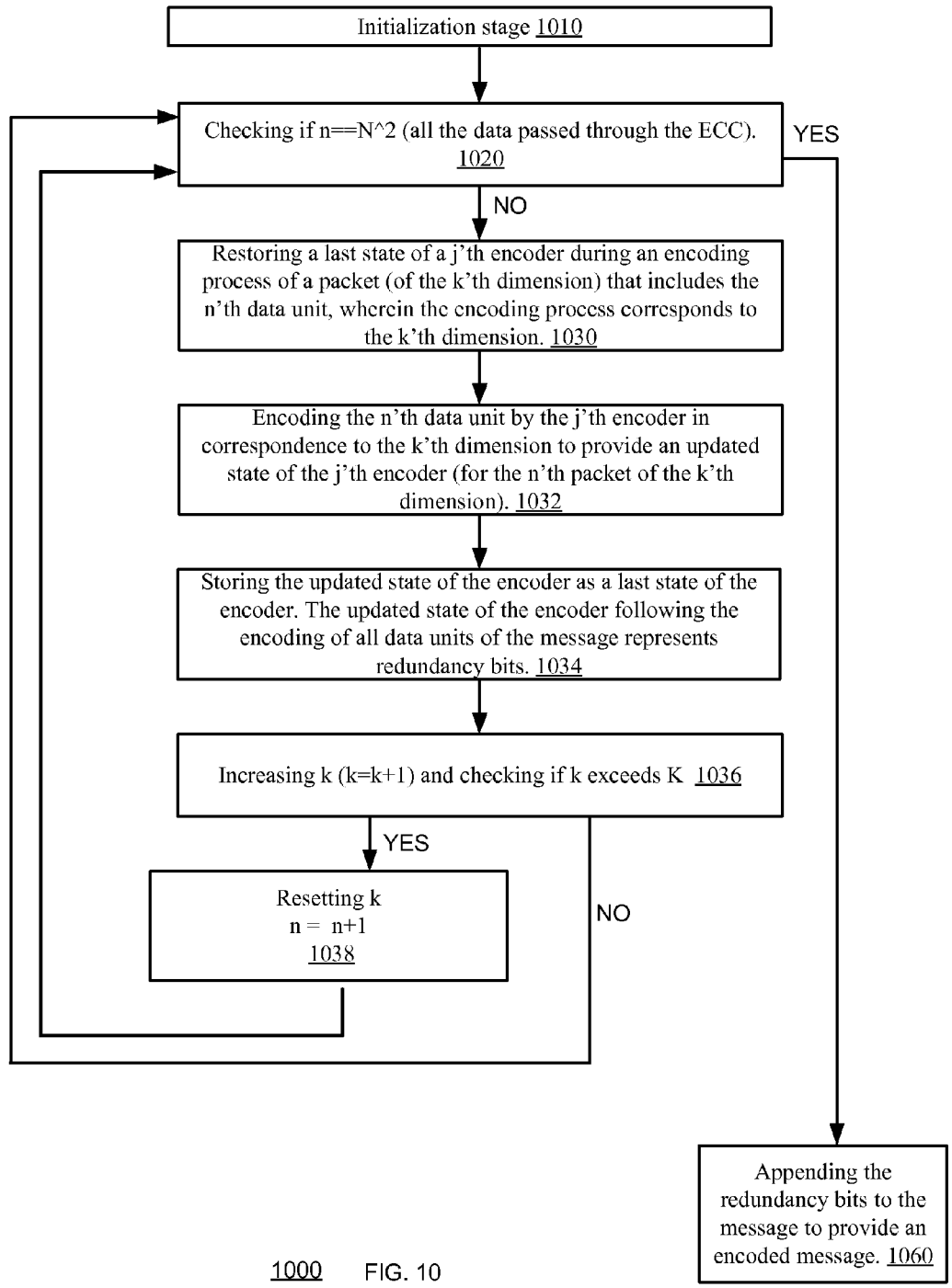
FIG. 10 illustrates a method for multiple dimensional encoding of a message, according to an embodiment of the invention.

FIG. 10 illustrates method 1000 for multiple dimensional encoding of a message, according to an embodiment of the invention.

Method 1000 starts by initialization stage 1010. This stage may include configuring a multiple dimensional decoding system—determining the number and size of packets, determining the allocation of decoders (if there are more than one decoder) to the decoding of different dimensions, determining the error correction algorithm, the number of errors that can be corrected, the number (K) of dimensions and the ordering (permutations) of packets per dimension, and the like.

In the example set forth in FIG. 7 there is a single ECC engine and thus J equals 1 and index j does not change during the process.

In the example set forth in FIG. 8 there is a single ECC engine per dimension and index j changes with the change of the dimension. Index j may equal index k but this is not necessarily so.

Stage 1010 may include setting values of control variable such as setting a dimension counter k to 1 (k=1), setting a data unit counter n to zero (n=0) and setting an encoder counter j to 1 (j=1).

Dimension counter k may range between 1 and K. Data unit counter can range between 1 and N. Encoder counter j ranges between 1 and J.

It is noted that a residual encoder can be allocated for encoding the first dimension—and it may perform an in-order encoding that does not require restoring the last state of the residual encoder at a memory unit that differs from the encoder and does not require storing the updated state of the residual encoder as a last state of the residual encoder in the memory. In this case j may range between 2 and J.

Stage 1010 may be followed by stage 1020 of increasing n by one when receiving a data unit and checking if n>N*N meaning that all data units of a message have been encoded. If-so jumping to stage 1060. Else—this data unit is to be referred to as the n'th data unit and stage 1020 is followed by stage 1030.

This stage may include storing the n'th data unit by a memory that has a size that is smaller than a size of the message.

Stage 1030 includes restoring a last state of a j'th encoder during an encoding process of a packet (of the k'th dimension) that includes the n'th data unit, wherein the encoding process corresponds to the k'th dimension.

Stage 1030 may be followed by stage 1032 of encoding the n'th data unit by the j'th encoder in correspondence to the k'th dimension to provide an updated state of the j'th encoder (for the n'th packet of the k'th dimension).

Stage 1032 may be followed by stage 1034 of storing the updated state of the encoder as a last state of the encoder. The updated state of the encoder following the encoding of all data units of the message represents redundancy bits.

Stage 1034 may be followed by stage 1036 of increasing k (k=k+1) and checking if k exceeds K.

If k does not exceed K then jumping to stage 1020.

Stage 1040 is followed by stage 1020. If k exceeds K (for this data unit all dimensions were encoded) then stage 1036 is followed by resetting k, increasing n (n=n+1) and 38) and jumping to stage 1020. In this case all the calculation for all the K dimensions are done for the n'th data unit.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A method for multiple dimensional encoding of a message, comprising:
   repeating, for each data unit that belongs to the message the stages of:
      receiving by a processor the data unit;
      executing by the processor, for each dimension of a plurality of dimensions of the multiple dimension, the stages of:
         restoring a last state of an encoder during an encoding process of a packet that comprises the data unit, wherein the encoding process corresponds to the dimension;
         encoding the data unit by the encoder in correspondence to the dimension to provide an updated state of the encoder; and
         storing the updated state of the encoder as a last state of the encoder; wherein the updated state of the encoder following the encoding of all data units of the message represents redundancy bits;
   and
   adding the redundancy bits to the message to provide a multiple dimensional encoded message.

2. The method according to claim 1, wherein the plurality of dimensions are a subset of the multiple dimensions.

3. The method according to claim 2, further comprising:
   decoding, for a residual dimension that belongs to the multiple dimensions and does not belong to the plurality of dimensions, all data units that form the message in a sequential manner by a residual encoder allocated to the residual dimension without restoring the last state of the residual encoder at a memory unit that differs from the encoder.

4. The method according to claim 1, comprising encoding data units of the message in correspondence to each of the plurality of dimensions by a same encoder.

5. The method according to claim 1, comprising encoding data units of the message in correspondence to different dimensions of the plurality of dimensions by different encoders.

6. The method according to claim 1, wherein the encoding comprises error correction encoding of the data unit.

7. The method according to claim 1, wherein the receiving of the data unit comprises storing the data unit by a memory that has a size that is smaller than a size of the message.

8. A system that comprises a memory and a processor, comprising:
   wherein the memory is arranged to receive a data unit;
   wherein the processor is arranged to execute, for each dimension of a plurality of dimensions of the multiple dimension, the stages of (a) restoring from the memory a last state of an encoder during an encoding process of a packet that comprises the data unit, wherein the encoding process corresponds to the dimension, and (b)

encoding the data unit by the encoder in correspondence to the dimension to provide an updated state of the encoder;

wherein the memory is arranged to store the updated state of the encoder as a last state of the encoder; wherein the updated state of the encoder following the encoding of all data units of the message represents redundancy bits; and wherein the processor is arranged to add the redundancy bits to the message to provide a multiple dimensional encoded message.

9. The system according to claim 8 wherein the plurality of dimensions are a subset of the multiple dimensions.

10. The system according to claim 9 wherein the processor is arranged to decode, for a residual dimension that belongs to the multiple dimensions and does not belong to the plurality of dimensions, all data units that form the message in a sequential manner by a residual encoder allocated to the residual dimension without restoring the last state of the residual encoder at a memory unit that differs from the encoder.

11. The system according to claim 8, wherein the processor is arranged to encode data units of the message in correspondence to each of the plurality of dimensions by a same encoder.

12. The system according to claim 8, wherein the processor is arranged to encode data units of the message in correspondence to different dimensions of the plurality of dimensions by different encoders.

13. The system according to claim 8, wherein the processor is arranged to perform error correction encoding of the data unit.

14. The system according to claim 8, wherein the memory has a size that is smaller than a size of the message.

15. A method for multiple dimensional decoding of a decoded message, comprising:
    repeating, for each decoded data unit that belongs to the decoded message the stages of:
        receiving by a processor the decoded data unit;
        executing by the processor, for each dimension of a plurality of dimensions of the multiple dimension, the stages of:
            restoring a last state of an decoder during an encoding process of a decoded packet that comprises the decoded data unit, wherein the decoding process corresponds to the dimension;
            decoding the decoded data unit by the decoder in correspondence to the dimension to provide an updated state of the decoder; and
            storing the updated state of the decoder as a last state of the encoder; wherein the updated state of the encoder following the encoding of all data units of the message represents redundancy bits;
    and
    adding the redundancy bits to the message to provide a multiple dimensional encoded message.

16. A system for multiple dimensional decoding of a decoded message, the system comprising a memory and a processor; wherein the memory is arranged to store a decoded message;
    wherein the processor is arranged to repeat, for each decoded data unit that belongs to the decoded message:
        receive the decoded data unit;
        execute for each dimension of a plurality of dimensions of the multiple dimension, the stages of:
            restoring a last state of an decoder during an encoding process of a decoded packet that comprises the decoded data unit, wherein the decoding process corresponds to the dimension;
            decoding the decoded data unit by the decoder in correspondence to the dimension to provide an updated state of the decoder; and
            storing the updated state of the decoder as a last state of the encoder; wherein the updated state of the encoder following the encoding of all data units of the message represents redundancy bits;
    and
    add the redundancy bits to the message to provide a multiple dimensional encoded message.

* * * * *